United States Patent
Agarwal et al.

(10) Patent No.: US 8,217,671 B2
(45) Date of Patent: Jul. 10, 2012

(54) PARALLEL ARRAY ARCHITECTURE FOR CONSTANT CURRENT ELECTRO-MIGRATION STRESS TESTING

(75) Inventors: Kanak B. Agarwal, Austin, TX (US); Peter A. Habitz, Hinesburg, VT (US); Jerry D. Hayes, Georgetown, TX (US); Ying Liu, Austin, TX (US); Deborah M. Massey, Jericho, VT (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 454 days.

(21) Appl. No.: 12/492,619

(22) Filed: Jun. 26, 2009

(65) Prior Publication Data

US 2010/0327892 A1 Dec. 30, 2010

(51) Int. Cl.
*G01R 31/00* (2006.01)
(52) U.S. Cl. .............. 324/750.03; 324/762.01
(58) Field of Classification Search .......... None
See application file for complete search history.

(56) References Cited

U.S. PATENT DOCUMENTS

| | | | |
|---|---|---|---|
| 5,309,090 A | 5/1994 | Lipp | |
| 5,532,600 A | 7/1996 | Hoshino | |
| 5,625,288 A | 4/1997 | Snyder et al. | |
| 5,911,897 A | 6/1999 | Hamilton | |
| 6,492,620 B1 | 12/2002 | Lau | |
| 6,559,667 B1 | 5/2003 | Tarter | |
| 6,714,037 B1 | 3/2004 | Hau-Riege et al. | |
| 7,129,722 B1 * | 10/2006 | Brophy et al. | 324/750.25 |
| 7,161,368 B2 | 1/2007 | Huber et al. | |
| 7,183,784 B2 | 2/2007 | Maggi et al. | |
| 7,327,152 B2 * | 2/2008 | Fischer et al. | 324/750.3 |
| 7,521,952 B2 | 4/2009 | Chanda et al. | |
| 2006/0066335 A1 * | 3/2006 | Kang et al. | 324/760 |
| 2006/0275935 A1 | 12/2006 | Peacock et al. | |
| 2008/0265931 A1 | 10/2008 | Hsu et al. | |

* cited by examiner

*Primary Examiner* — Minh N Tang
(74) *Attorney, Agent, or Firm* — Stephen J. Walder, Jr.; Libby Z. Toub

(57) ABSTRACT

A parallel array architecture for constant current electro-migration stress testing is provided. The parallel array architecture comprises a device under test (DUT) array having a plurality of DUTs coupled in parallel and a plurality of localized heating elements associated with respective ones of the DUTs in the DUT array. The architecture further comprises DUT selection logic that isolates individual DUTs within the array. Moreover, the architecture comprises current source logic that provides a reference current and controls the current through the DUTs in the DUT array such that each DUT in the DUT array has substantially a same current density, and current source enable logic for selectively enabling portions for the current source logic. Electro-migration stress testing is performed on the DUTs of the DUT array using the heating elements, the DUT selection logic, current source logic, and current source enable logic.

19 Claims, 9 Drawing Sheets

PARALLEL ARRAY ARCHITECTURE FOR CONSTANT CURRENT ELECTRO-MIGRATION STRESS TESTING

BACKGROUND

The present application relates generally to electro-migration stress testing mechanisms and more specifically to mechanisms for performing electro-migration stress testing using a parallel array architecture.

Electro-migration is the transportation of material caused by the gradual movement of ions in a conductor. Specifically, electro-migration is the phenomenon in which the metal ions of a metal conductor will tend to migrate in the opposite direction of the flow of current through the metal conductor. The ions in the conductor move due to the momentum of transfer between conducting electrons and diffusing metal atoms.

FIG. 1 illustrates an example of how metal ions 10 can migrate over time along a conductor 12, even migrating beyond the boundary of the conductor 12 itself. As discussed hereafter, factors that contribute to electro-migration include the cross-sectional area of the conductor 12, current density through the conductor 12, and temperature. Over the course of time, the metal ions 10 of the conductor 12 can migrate to such a degree that voids 14 are created where the ions have left. These voids 14, when large enough, can impede the flow of current and therefore present a noticeable increase in resistance of the conductor 12.

In an extreme condition, electro-migration can create voids that span across the width of the conductor 12, thereby electrically isolating one portion of the conductor 12 from another and resulting in an open circuit condition. The open circuit condition results in a failure of the conductor and any interconnects that utilize this conductor. Such electro-migration effects are important in applications where high direct current densities are used, such as in microelectronics. As the size of the microelectronics decrease, the practical significance of electro-migration increases.

Electro-migration decreases the reliability of such microelectronics and thus, the resulting integrated circuits that utilize these microelectronics. In worst cases, electro-migration leads to the eventual loss of one or more connections and intermittent failure of the entire circuit. This can be catastrophic in microelectronics used in space, military, and safety electronics, and is generally troublesome and costly in commercial electronics.

Due to the relatively long life span of microelectronic interconnects, and the short product life cycle of most consumer integrated circuits, it is not practical to characterize a product's electro-migration under real operating conditions. To the contrary, Black's equation is commonly used to predict the life span of microelectronic interconnects in integrated circuits tested under "stress." Black's equation is as follows:

$$\text{Mean Time to Failure (MTTF)} = A(J^{-n})e^{E\alpha/kT}$$

where A is a constant based on the cross-sectional area of the interconnect, J is the current density, $E\alpha$ is the activation energy, k is the Boltzmann's constant, T is the temperature, and n is the scaling factor (usually set to 2 according to Black's model). As can be seen from this equation, the current density J and the temperature T are the dominant factors in the design process that affect electro-migration. The temperature T factor appears in the exponent of the equation and thus, it strongly affects the mean time to failure (MTTF) of the interconnect. Therefore, in order for an interconnect to remain reliable in rising temperatures, the maximum tolerable current density of the conductor must decrease.

Electro-migration effects occur over a long period of time, e.g., many years, and thus, as mentioned above, it is not feasible to perform electro-migration testing of active microelectronic device under normal operating conditions. However, it is important to characterize such electro-migration effects with independent control over the current density and temperature in order to determine the reliability of the interconnects of the microelectronics, especially in such technology areas as space, military, and safety electronics. As a result, electro-migration testing typically involves applying a "stress" to a small number of devices under test (DUTs), in order to accelerate the aging of the DUTs to determine the Mean Time to Failure. The "stress" of such stress testing is generated by applying external heat to the entire wafer on which the DUTs reside and providing current to each DUT to effectively age the DUT to determine the temperature and current density at which the DUT fails. For example, the wafer is placed on or in close proximity to a tester heat chuck which increases the temperature of the DUT to between 300 and 400 degrees Celsius. Four probes are typically used to measure the electro-migration of the DUT, 2 probes to force a current through the DUT and 2 probes to sense the voltage across the DUT. These probes must typically be placed on the pins and left there for long periods of time (sometimes around 100 hours), in order to perform the electro-migration measurements.

The results of applying the stress to the DUT is observed to determine how the DUT's characteristics change during the time of the test. This information may then be used to predict how the conductors of the actual microelectronic component might change during the normal life of the component. During this test, a sensor detects any changes in resistance of the DUT as a result of the application of the high current and temperature. A noticeable change in resistance signifies a potential electro-migration problem.

A severe limitation to this characterization strategy is the bottleneck in DUT throughput. Only a relatively small number of devices can be characterized at a time due to the limited number of tester channels available. Since each DUT requires 4 dedicated tester channels, it lacks the scalability necessary for massive DUT parallelization that is required for statistical studies of electro migration. One technique to increase DUT parallelization without increasing tester requirements is to use active devices such as NFETs and PFETs; however the excessive temperature environment established when heating the entire wafer during stress prohibits the use of active devices.

SUMMARY

In one illustrative embodiment, a parallel array architecture for constant current electro-migration stress testing is provided. The parallel array architecture comprises a device under test (DUT) array having a plurality of DUTs coupled in parallel and a plurality of localized heating elements associated with respective ones of the DUTs in the DUT array. The architecture further comprises DUT selection logic that isolates individual DUTs within the array. Moreover, the architecture comprises current source logic that provides a reference current and controls the current through the DUTs in the DUT array such that each DUT in the DUT array has substantially a same current density, and current source enable logic for selectively enabling portions for the current source logic. Electro-migration stress testing is performed on the DUTs of the DUT array using the heating elements, the DUT selection logic, current source logic, and current source enable logic.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

The illustrative embodiments further provide a method for providing such a parallel array architecture and a method for utilizing such an architecture to perform electro-migration stress testing. Moreover, still further illustrative embodiments provide methods and computer program products for controlling electro-migration stress testing using such a parallel architecture.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide mechanisms for performing electro-migration stress testing of a plurality of devices under test (DUTs) using a parallel architecture. With the mechanisms of the illustrative embodiments, a device under test (DUT) array is provided with a plurality of DUTs having localized heaters for heating the DUTs. Voltage supply lines provide the potential required to produce current flow through the DUT elements, extrusion elements, and heater elements. The currents sourced by these supply lines are measured for the extrusion and DUT elements. Voltage sense lines are used to measure the IR drop and extract resistance for both DUT and extrusion type elements for characterizing DUT electro-migration and local DUT temperature respectively.

Active DUT selection elements are provided outside the DUT array for selectively enabling the stress testing of individual DUTs in the DUT array. Active current source circuitry with tunable multi-tapped current mirror elements are provided for controlling the current through the DUTs to be a constant current; the constant current being either a reference current or a multiple of the reference current. Similarly, active current select elements are provided for enabling current source connections to the DUTs in the DUT array. The active elements are thermally isolated from the DUT array such that the high temperatures at which the DUTs are stress tested do not affect the operation of the active elements. The DUTs are provided in a parallel architecture and may be selectively tested by virtue of the active elements.

The tunable multi-tapped current mirrors isolate their corresponding DUTs in the DUT array to thereby facilitate parallelization. Moreover, the tunable multi-tapped current mirrors allow the gain of the current mirrors to be tuned to allow constant density stress profiles to be applied to DUTs of varying cross-sectional area. This facilitates DUT variety within the same DUT array. Furthermore, by way of the current source selection active elements, the current mirrors allow varying time dependent stress profiles to be applied across individual DUTs.

Figure 2:
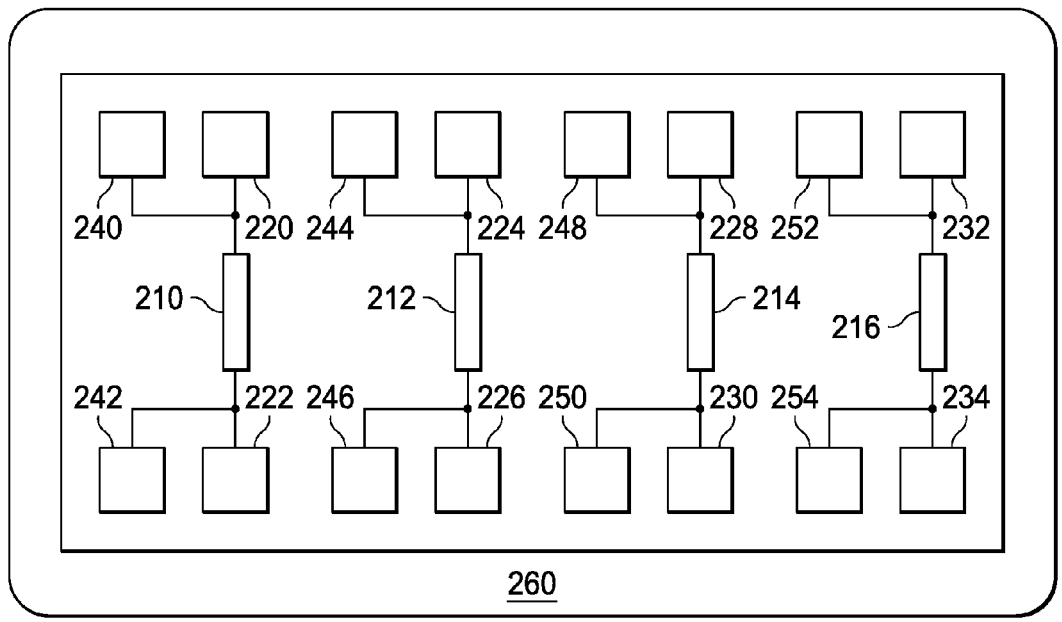
FIG. 2 is an example diagram of a prior art mechanism or performing electro-migration stress testing.

As noted above, in known electro-migration (EM) stress testing architectures, four probes are typically used per device under test (DUT) with the testing of the DUTs being performed in a non-parallel manner, i.e. in a serial manner. FIG. 2 is an example block diagram illustrating a prior art approach to EM stress testing. As shown in FIG. 2, each DUT 210-216 is coupled to a pair of force pads/pins 220-234. Sense pads/pins 240-254 are coupled to the DUTs 210-216 to thereby sense the voltage associated with the DUTs 210-216. The DUTs 210-216 are heated to a desired temperature, e.g., between 300 and 400 degrees Celsius, by the common tester heat chuck 260. The common tester heat chuck 260 heats all of the DUTs 210-216 at the same time. The elevated temperature serves to accelerate the aging of the DUTs 210-216. The sensed current and sensed voltage are used to determine the resistance of the DUTs 210-216 at various time points during the stress test. The resistance is indicative of electro-migration effects in that if the resistance increases above a baseline resistance of the DUTs 210-216 by more than a predetermined threshold, it can be determined that electro-migration effects are causing voids in the conductors of the DUTs 210-216 which increase the resistance of the DUTs 210-216. Based on the current density applied to the DUTs 210-216, the temperature of the DUTs 210-216, and the cross sectional area of the DUTs 210-216, a mean time to failure (MTTF) may be calculated using Black's equation as noted above.

As shown in FIG. 2, each DUT 210-216 is separate from each other DUT 210-216 and has its own set of 4 pads/pins used for the stress test. Thus, in the prior art approach to EM stress testing, assuming there are 4 tester channels available, probes (not shown) must be placed on the 4 pads/pins of a first DUT 210 and the stress test must be performed for a predetermined period of time in order to gather sufficient information to determine a mean time to failure for DUTs 210-216. Typically stress continues until a predefined failure criteria has been met which may be defined as a resistance increase of a certain amount above the baseline resistance. The probes may then be moved to the next DUT 212 and the process repeated. Thus, the stress testing is performed in a serial manner which greatly increases the time to complete the stress testing. Such stress testing may require anywhere between 1 and 100 hours in some instances. Any parallelization achieved using this technique is accomplished by increasing the number of tester channels and tester cost.

Figure 3:
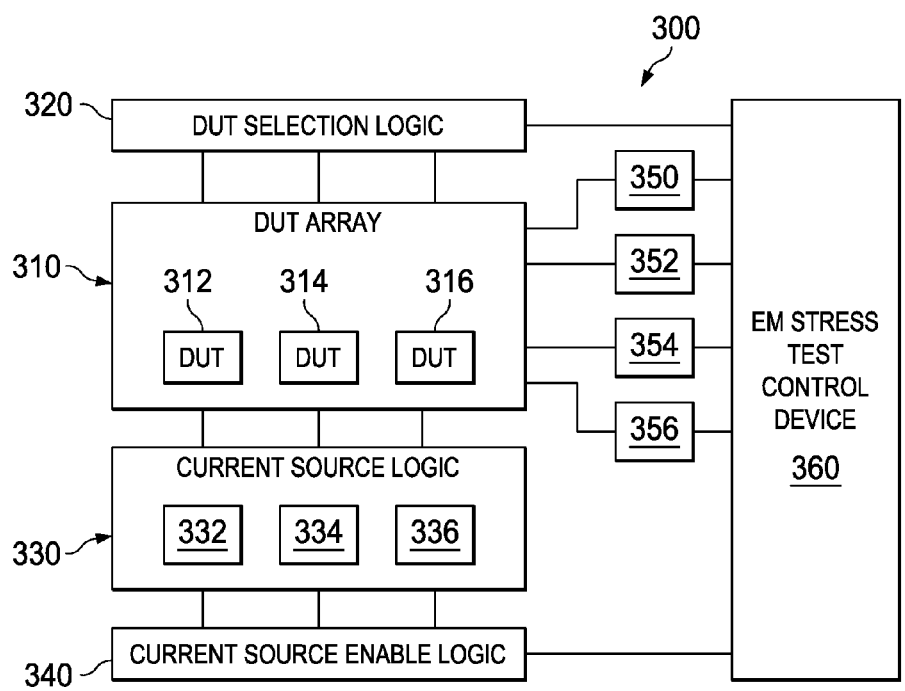
FIG. 3 is an example block diagram of a electro-migration (EM) stress testing architecture in accordance with one illustrative embodiment.

FIG. 3 is an example block diagram of an electro-migration (EM) stress testing architecture in accordance with one illustrative embodiment. As shown in FIG. 3, the EM stress architecture 300 comprises a DUT array 310, DUT selection logic 320, current source logic 330, and current source enable logic 340. The DUT array 310 is thermally isolated from the DUT selection logic 320, current source logic 330, and current source enable logic 340, the logic 320-340 being active logic elements that perform functions while DUTs in the DUT array 310 are subjected to high temperatures, e.g., 300 to 400 degrees Celsius, for purposes of EM stress testing the DUTs. The DUT array 310 may be thermally isolated, for example, by using localized metal structures as heat sinks that direct thermal energy away from the active devices. It should be appreciated that other mechanisms for thermally isolating the DUT array 310 from the active logic elements may be used without departing from the spirit and scope of the illustrative embodiments.

The DUT array 310 comprises a plurality of DUTs 312-316 coupled to voltage and current lines in parallel. The DUTs 312-316 may be, for example, a conductor, e.g., a metal element, whose resistance is measured by the mechanisms of the illustrative embodiments, under stress conditions, e.g., high temperature and constant current, to see how electro-migration affects the DUTs 312-316 to determine a mean time to failure of the DUTs 312-316.

Each DUT in the DUT array 310 has localized heating elements (see FIGS. 4A and 4B hereafter) in close proximity to the DUT that operate to provide localized heating to the DUT. In addition, metal extrusion elements (see FIGS. 4A and 4B hereafter) are provided in association with the DUTs for operating as thermal sensors and short detectors, as discussed in greater detail hereafter. With the parallel configuration of the DUT array 310, the same four pads/pins 350-356 are used to sense the necessary outputs for characterizing the EM effects on each of the DUTs 312-316 of the DUT array 310. That is, rather than having to have four pads/pins for each DUT 312-316 in the DUT array 310, with the illustrative embodiment, regardless of the number of DUTs 312-316 in the DUT array 310, the maximum number of pads/pins needed to perform EM stress testing on all of the DUTs 312-316 in the DUT array 310 is a total of four pads/pins since all of the DUTs 312-316 share the same four pads/pins due to the parallel arrangement of the DUTs 312-316. This greatly reduces the area and number of pads/pins needed to conduct EM stress testing. Moreover, the EM stress testing is performed in parallel, thereby reducing the required time to conduct EM stress testing.

The DUT selection logic 320 is used to select individual DUTs 312-316 within the DUT array 310. Essentially, the DUT selection logic 320 provides inputs to the DUT array 310 to effectively isolate a DUT 312-316 within the DUT array 310 to perform measurements of the outputs for the selected DUT at the four pads/pins 350-356. By sequentially selecting the DUTs 312-316, appropriate measurements for characterizing the EM effects on the DUTs 312-316 may be made while isolating the DUTs 312-316 from the other DUTs 312-316 using the parallel architecture.

The current source logic 330 provides a reference current and a plurality of tunable gain multi-tapped current mirrors 332-336 for ensuring a constant current across each of the individual DUTs 312-316 in the DUT array 310. The tunable gain aspect of the current mirrors allow for constant stress profiles to be applied to DUTs of varying cross-sectional area. Thus, the current mirrors 332-336 facilitate DUT variety within the same DUT array 310. Moreover, the current mirrors being multi-tapped allows the current mirrors to further isolate each DUT 312-316 within the DUT array 310 to facilitate parallelization. The selection of which current mirrors to enable/disable is made by the current source enable logic 340.

The inputs to the DUT array 310, DUT selection logic 320, and current source enable logic 340 are provided by an EM test control device 360. The EM test control device 360 may further receive the outputs from the DUT array 310 and analyze these outputs to characterize the EM effects on the individual DUTs 312-316. For example, the EM test control device 360 may obtain the output from the DUT array 310 and determine a resistance value for one or more of the DUTs 312-316. This resistance value may then be compared to a baseline or original resistance value measured and stored by the EM test control device 360 prior to application of the EM stress test to determine if the resistance has appreciably increased, i.e. a change in resistance equal to or in excess of a predetermined threshold. If such a change in resistance has occurred, then a determination may be made that the DUT 312-316 has experienced EM effects that may cause a failure of the DUT 312-316. This information may then be used to determine a mean time to failure, such as by using Black's equation as noted above.

Figure 4A:
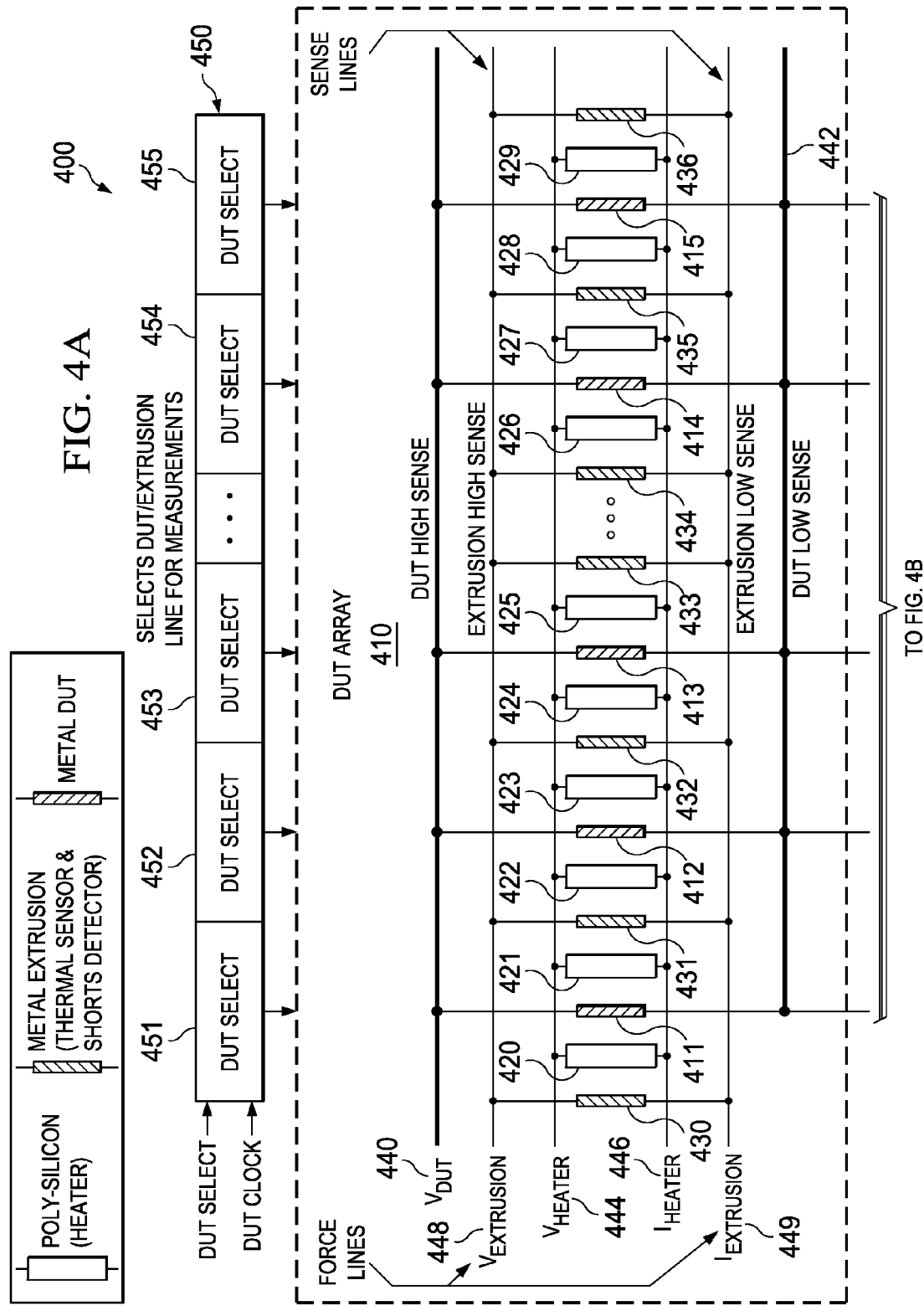
FIGS. 4A and 4B are an example diagram of an EM stress testing architecture illustrating details of the DUT array and active elements in accordance with one illustrative embodiment.
Figure 4B:
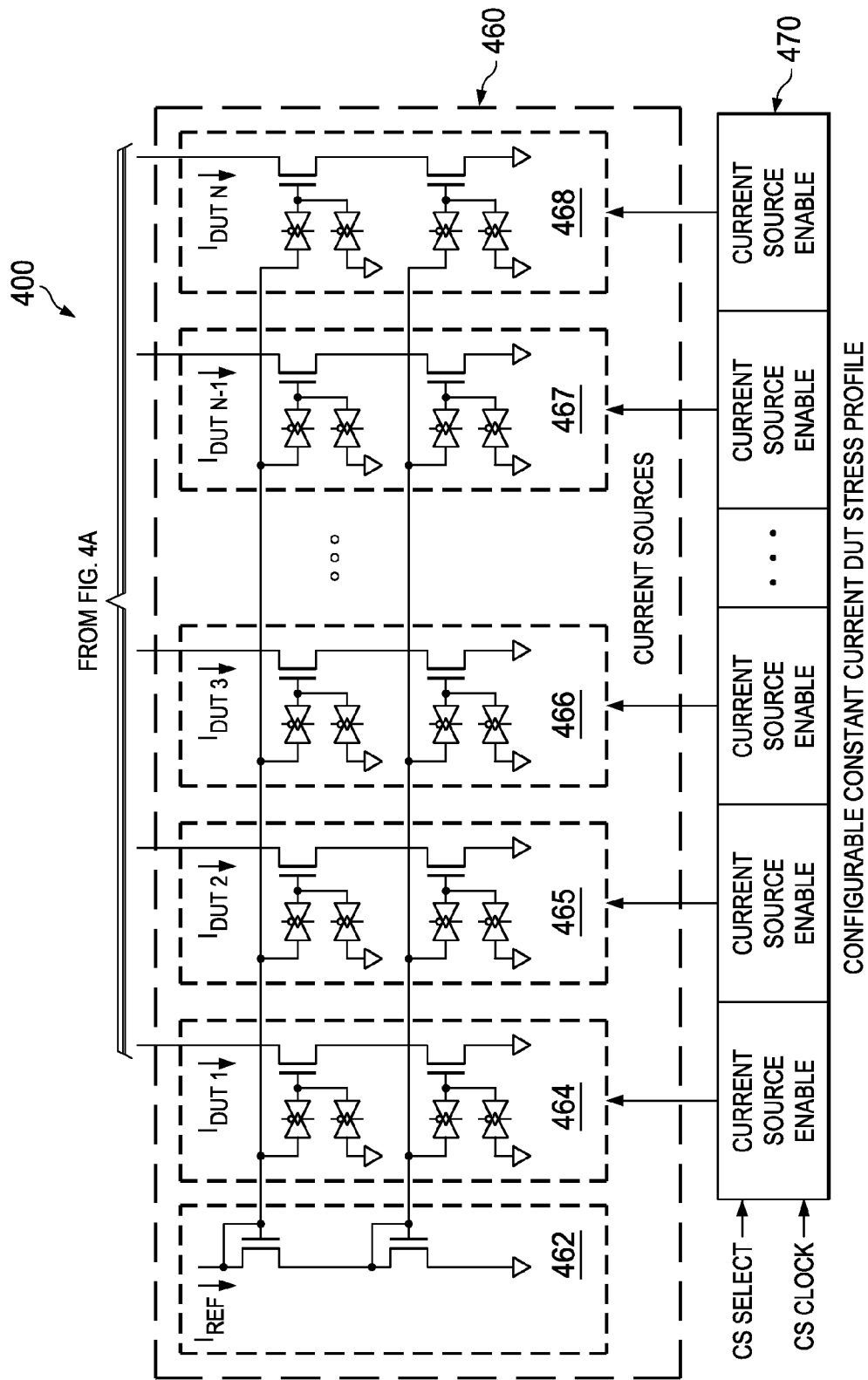

FIGS. 4A and 4B are an example diagram of an EM stress testing architecture illustrating details of the DUT array and active elements in accordance with one illustrative embodiment. The example diagram of FIGS. 4A and 4B correspond to the similar elements shown in FIG. 3 but provides additional details for purposes of explaining the operation of one illustrative embodiment. It should be appreciated that the depiction of the placement of elements shown in FIGS. 4A and 4B, the number of each element shown in FIGS. 4A and 4B, and other configuration depictions are for illustration purposes only and are not intended to state or imply any limitations with regard to the present invention. To the contrary, many modifications may be made to the configuration of elements shown in FIGS. 4A and 4B without departing from the spirit and scope of the illustrative embodiments.

As shown in FIGS. 4A and 4B, the EM stress architecture 400 of this illustrative embodiment comprises a DUT array 410 having a plurality of DUTs 411-415, a plurality of heater elements 420-429, and a plurality of metal extrusion elements 430-436. The DUTs 411-415 are connected to a DUT voltage/high sense line ($V_{DUT}$) 440 and DUT low sense line 442 in parallel. Similarly, the heater elements 420-429 are coupled to a heater voltage line ($V_{HEATER}$) 444 and current line ($I_{HEATER}$) 446 in parallel. While the heater elements 420-429 are shown as being positioned on either side of the DUTs 411-415, the illustrative embodiments are not limited to such. To the contrary, in some implementations, the heater elements 420-429 may be placed directly beneath the DUTs 411-415 or at least in close proximity to a corresponding DUT 411-415 whether to the side, above, or beneath the DUT 411-415.

In addition to the DUTs 411-415 and heater elements 420-429, the DUT array 410 further includes metal extrusion elements 430-436 coupled to voltage ($V_{EXTRUSION}$) and current extrusion ($I_{EXTRUSION}$) lines 448 and 449 in parallel. The DUT voltage/high sense line 440, DUT low sense line 442, voltage extrusion line/high sense line 448, and current extrusion/low sense line 449 provide outputs to pads/pins (not shown), such as pads/pins 350-356 in FIG. 3, for output to the EM test control device, such as EM test control device 360 in FIG. 3.

DUT selection logic 450 has a plurality of DUT selection logic elements 451-455, which may comprise one or more latches, for example, one for each of the DUTs 411-415. The DUT selection logic elements 451-455 receive a DUT clock signal and DUT selection signal as input and, based on these inputs, determine which of the DUT selection logic elements 451-455 are to turn on their corresponding DUT 411-415 and corresponding metal extrusion elements 430-436 for purposes of measuring the DUT's resistance. A more detailed diagram of the logic used to turn on DUTs 411-415 and their corresponding metal extrusion elements 430-436 is provided hereafter.

The current sources 460 comprising reference current generation logic 462 and a plurality of current mirror logic 464-468. A current mirror is a circuit designed to copy a current through one active device by controlling the current in another active device of a circuit, keeping the output current constant regardless of loading. In the illustrative embodiment, the current through the reference current generation logic 462 is mirrored by the current mirrors such that the current through the DUTs 411-415 are a multiple of the reference current $I_{REF}$. Thus, in one illustrative embodiment, each of the currents $I_{DUT1}$ to $I_{DUT\,N}$ through the DUTs 411-415 is equal to $I_{REF}$ by way of the current mirror logic 464-468. In other illustrative embodiments, at least one of the currents through the DUTs 411-415 is a multiple of $I_{REF}$ that is greater than $I_{REF}$, e.g., $2*I_{REF}$, $3*I_{REF}$, etc., based on the particular cross sectional area of the corresponding DUT 411-415. The multiple of $I_{REF}$ is generated by virtue of the tunable gains of the current mirror logic 464-468 that are tuned to compensate for differences in cross sectional area of corresponding DUTs 411-415 such that an initial target current density is applied across the DUT array 410.

The current source enable logic 470 selectively enables/disables one or more of the current mirror logic elements 464-468 based on the current source input signal (CS select). The selective enabling/disabling of the current mirror logic elements 464-468 is performed to facilitate EM stress testing of the DUTs, current mirror characterization, and DUT to extrusion element short tests. For example, when performing EM stress testing of the DUTs, the current source enable logic 470 enables the current mirror logic elements 464-468. When performing DUT to extrusion element short tests, the current mirror logic elements 464-468 are disabled by the current source enable logic 470. When performing current mirror characterization operations, all of the current mirror logic elements 464-468 are turned off by the current source enable logic 470 except the current mirror logic that is being characterized. More detail regarding each of these operations will be provided hereafter with regard to corresponding figures.

As mentioned above with regard to FIG. 3, an EM stress test control device, such as EM stress test control device 360 in FIG. 3, provides the necessary inputs for controlling the EM stress testing and measurement of output values for purposes of characterizing EM effects on the various DUTS 411-415 of the DUT array 410. For example, the EM stress test control device provides the DUT select input signal and current source select signal. Such signals may be of a scan chain input signal type in which bits of the input signal indicate which corresponding logic in the DUT select logic 450 and current source enable logic 470, which may be configured as scan chains, is enabled/disabled. The EM stress test control device, or other tester hardware, may further provide all the other current and voltage inputs to the DUT array in order to perform the EM stress testing in accordance with the illustrative embodiments.

With the mechanisms of the illustrative embodiments, initially the resistance of the DUTs 411-415 in the DUT array 410 is determined at a time t0 when there is no thermal stress being applied to the DUTs 411-415. The measuring of the resistance of the DUTs 411-415 is performed by selectively enabling the DUTs 411-415 using the DUT selection logic 450 and enabling the current mirrors of the current sources 460. The resulting outputs on the DUT voltage/high sense line 440 and DUT low sense line 442 are used to measure the resistance of the DUTs 411-415 using the relation $R_x=V_{DUT}/I_{DUTx}$ where x is the number of the DUT 411-415 from 1 to N. This is done to determine the initial DUT cross-sectional area and to perform the initial current density calculation. For example, wire resistance may be expressed as $R=\rho L/A$ where $\rho$ (resistivity) and L (length) are known from materials and layout. With R measured, A (area) can be derived. With A now derived, current density (J) is approximated as J=I (current)/A (area).

Thereafter, heat is applied to the DUTs 411-415 to drive their temperature to a predetermined temperature for performing EM stress testing, e.g., a temperature in the range of 300 to 400 degrees Celsius. The heat is applied by providing the voltage $V_{HEATER}$ on voltage line 444 to the heating elements 420-429 and pulling current through the heating elements 420-429 by sinking current on $I_{HEATER}$ 446. The heating is allowed to be performed for a predetermined period of time, e.g., 10 seconds, to allow the temperature of the DUTs 411-415 to become uniform and non-varying. Thereafter, at a time t1, an initial measure of the resistances of the DUTs 411-415 is made at the stress temperature in a similar manner as the initial resistance at t0 without the heat being applied.

After the initial measures of the resistances of the DUTs 411-415 are made at time t1, the stress current is applied to all of DUTs 411-415 by enabling the current mirrors of the current source such that the reference current is mirrored through the DUTs 411-415 to thereby drive the currents through the DUTs 411-415 to be either the reference current or a multiple of the reference current based on the cross-sectional area of the DUTs 411-415. Then, for each DUT 411-415 of interest, the resistance of the DUT is measured by selecting the DUT 411-415 using the DUT selection logic 450 and measuring the outputs at the pads/pins. First, the current going through the DUT is measured, as described in FIG. 7 hereafter, and once the current is known, the DUT selection logic 450 is used to isolate the DUT for voltage measurement. The difference between DUT High Sense and DUT Low Sense in FIGS. 4A and 4B is the voltage across the DUT. Knowing the current and voltage, the resistance can then be calculated.

In addition, for each DUT, an extrusion short test is performed. If the DUT resistance increases by a predetermined amount or more over the original resistance at time t1, e.g., increases by 20% or more, then the DUT is determined to have failed. Moreover, if the extrusion short test indicates that the DUT has shorted to the extrusion device, then the DUT is also determined to have failed.

Figure 5:
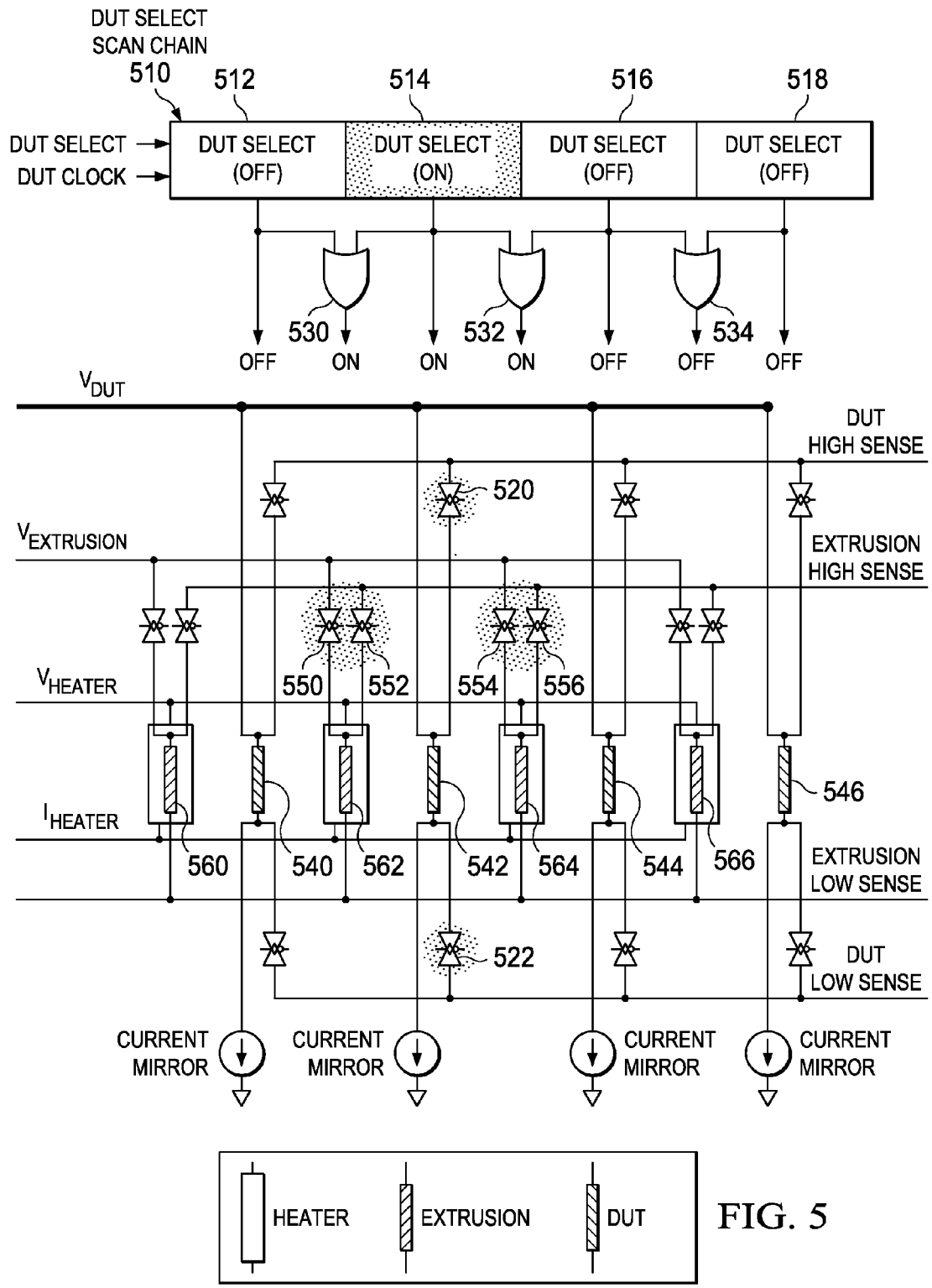
FIG. 5 is an example diagram illustrating isolation of DUTs in the DUT array in accordance with one illustrative embodiment.

FIG. 5 is an example diagram illustrating isolation of DUTs in the DUT array in accordance with one illustrative embodiment. As described above, such isolation of DUTs is used to perform individual measures of resistance and extrusion short tests for individual DUTs of the DUT array. Such isolation of DUTs, in the depicted example, is achieved by controlling the operation of switch elements coupled to the DUTs. These switch elements, in one illustrative embodiment, are pass-gates which, when enabled provide a very low resistance path from input to output and when disabled, have a high resistance between input and output. Of course, other types of switch elements may be used without departing from the spirit and scope of the illustrative embodiments.

As shown in FIG. 5, the DUT select input signal, which is received by the DUT selection logic scan chain 510, identifies which DUT in the DUT array to isolate for purposes of measurement of the DUT's resistance and performance of a DUT to extrusion element short test. A corresponding DUT select logic element 514 outputs an "on" signal to switch elements 520 and 522 for enabling the output of the selected DUT 542 on DUT high sense and DUT low sense lines. The enabling of switch element 520 and 522 connect the high impedance sense lines, DUT high sense and DUT low sense, across the DUT for voltage measurement. All sense lines are high impedance (no current flow) in order to eliminate IR drops that would result in voltage measurement inaccuracy. The other DUT select logic elements 512 and 516-518 output "off" signals for keeping their corresponding DUTs 540 and 544-546 turned off so that the output on the DUT high sense line is the output of the selected DUT 542.

The "on" signal is further output to OR gates 530 and 532. The OR gates 530-532 receive the outputs from two adjacent DUT select logic elements in the DUT selection logic scan chain 510. If at least one of the inputs to the OR gate 530-532 is an "on" signal input, e.g., a "high" input, then the output of the OR gate 530-532 is also an "on" signal output. The output of the OR gates 530-532 is sent to corresponding switch elements 550-556 associated with extrusion elements 562 and 564, respectively, to thereby enable the extrusion element 562-564 such that its output is provided on the extrusion high sense line and extrusion low sense line. All other extrusion elements 560 and 566 are kept "off" such that they do not provide an output on the extrusion high sense line and extrusion low sense line. The extrusion lines are used to measure the temperature surrounding the selected DUT 542 and also to test for metal shorts due to void creation on the selected DUT 542.

Switch elements 550 and 554 connect extrusion lines 562 and 564 in parallel. One end of the parallel configuration is tied to $V_{extrusion}$, the other end to $I_{extrusion}$. A known current is forced through the parallel configuration by applying a voltage source to $V_{extrusion}$ and a current source to $I_{extrusion}$. Switch elements 552 and 556 are used to connect one end the 562 and 564 parallel configuration to the Extrusion high sense line, while the other the other end is tied to the Extrusion low sense line. These are used to measure the voltage across the parallel combination. With both current and voltage known, the extrusion line resistance can be calculated and used to estimate the temperature at the DUT 542.

The reasons why the extrusion lines are tied in parallel are that (1) for short tests shorts can be detected that occur on both sides of the DUT using the same measurement; and (2) the parallel combination measures the average of the temperature around the DUT. It should further be noted that the temperature obtained using poly-silicon heaters can vary greatly based upon process conditions and thus, the metal extrusion lines are used to determine the actual temperatures around the DUTs.

In order to determine if void creation was sufficient to cause metal from the DUT to flow over and short to one of the adjacent extrusion lines, a resistance check is performed between the DUT high sense and Extrusion high sense lines when the DUT is selected for measurement. If the resistance is high (e.g., on the order of thousands of ohms), then no short has occurred. If is it low (e.g., less than one hundred ohms) a short has occurred. The reason the resistance will never go to zero even with a short is because of the series channel impedances of the pass-gate devices as well as the resistance of the metal wires.

As mentioned above, in order to facilitate providing a constant current for each of the DUTs of the DUT array, the illustrative embodiments utilize tunable multi-tapped current mirrors in the current source logic to mirror a reference current, or a multiple of the reference current, through the DUTs. The tunable multi-tapped current mirrors are used to get the current stress to a targeted magnitude with the actual current being dependent upon a reference current and process variations.

Figure 6:
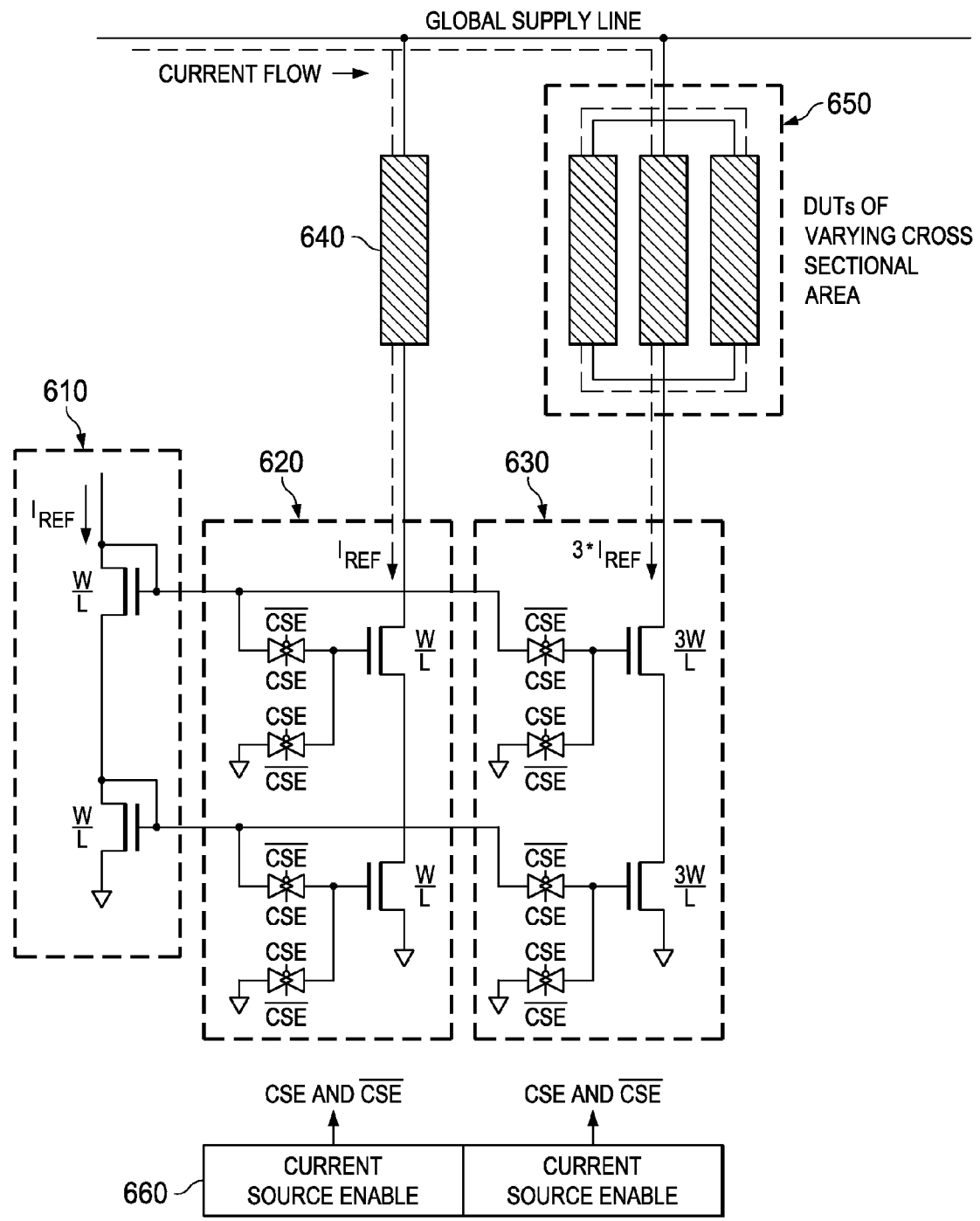
FIG. 6 is an example diagram illustrating tunable multi-tapped current mirrors of the current sources of one illustrative embodiment.

FIG. 6 is an example diagram illustrating tunable multi-tapped current mirrors of the current sources of one illustrative embodiment. As shown in FIG. 6, the reference current generation logic 610 generates a reference current $I_{REF}$ on one side of the current mirrors 620 and 630 which is then reflected through the current mirrors 620 and 630. The current mirrors have tunable gains W/L or X*W/L, where X is a multiple of the reference current. The gains of the current mirrors are preferably tuned according to the DUT estimated cross sectional area, which is known from the test structure layout that the designer controls.

As shown in FIG. 6, for this example, the DUT 640 has an expected cross sectional area and thus, the current passing through the DUT 640 is the reference current. The current mirror 620 forces the current through the DUT 640 to be the reference current with a gain of W/L. Similarly, the current mirror 630, which has a different gain of 3 W/L due to the cross sectional area of the DUT 650 being approximately 3 times the expected cross sectional area of the DUT. This forces the current through the DUT 650 to be 3 times the reference current. While the currents through the DUTs 640 and 650 are different, it is important to realize that the current density, which is an important factor in determining EM stress effects, is roughly equivalent between DUTs 640 and 650.

The particular current mirror 620 or 630 to enable may be selected by providing an appropriate current source enable signal to the current source enable scan chain 660. This allows for isolation of DUT 640-650 for stress purposes. Selecting DUTs for measurement is accomplished with the DUT selection logic 450 as discussed above. Moreover, the switchable current mirrors allow varying time dependent stress profiles to be applied across individual DUTs.

Furthermore, as shown in FIG. 6, the illustrative embodiments provide the ability to selectively apply, or not apply, a current stress to an individual DUT. Typically, one begins stressing all the DUTs simultaneously. Over time, some devices will fail faster than others, eliminating the need to continue stressing failed devices. With the mechanisms of the illustrative embodiments, the stress on failed devices may be selectively turned off while continuing to stress devices that have not yet failed.

Figure 7:
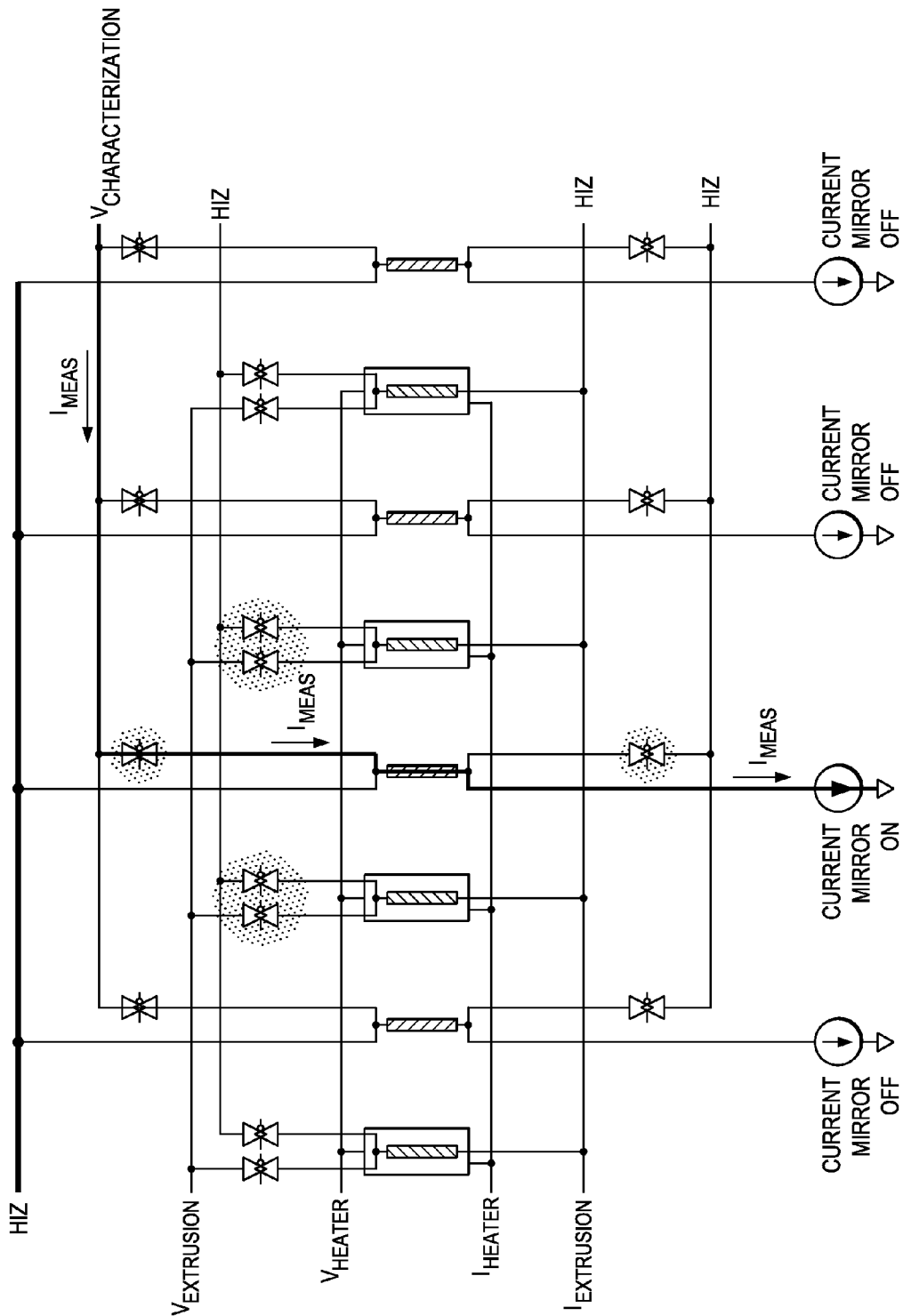
FIG. 7 is an example diagram illustrating current mirror characterization in accordance with one illustrative embodiment.

FIG. 7 is an example diagram illustrating current mirror characterization in accordance with one illustrative embodiment. Current mirror characterization is performed prior to performing the EM stress tests using the mechanisms of the illustrative embodiments. The current mirror characterization is used to measure the current through the DUTs. $V_{CHAR}$, which may be set externally by the testing equipment, enables characterization of the individual DUT currents and is used to keep the devices of the current mirror in saturation and to measure current $I_{MEAS}$. As long as $V_{CHAR}$ is well above $2*V_T$, e.g., above 1 Volt, then the current supplied by $V_{CHAR}$ represents the actual current of the current mirror that will flow through the DUT. The characterization of the current mirror along with an initial measure of the resistance of the corresponding DUT provides the necessary information for determining the initial DUT cross-sectional area and current density calculation, in a similar manner as previously described above using the relation $R=\rho L/A$.

As shown in FIG. 7, the current mirror characterization is performed by disabling the voltage to the DUTs via the $V_{DUT}$ line and applying the characterization voltage $V_{CHAR}$ on the DUT high sense line. A DUT is selected by using the DUT selection logic scan chain and a corresponding current mirror is selected using the current source enable scan chain, as previously described above. The current through the current mirror is measured from the $V_{CHAR}$ external supply, which is set to a fixed level, e.g., 1 Volt, and then gives the amount of current $I_{MEAS}$ that is being drawn from it. The current is not voltage level dependent as long as the current mirror is in saturation (normal operation). This provides the measured current $I_{MEAS}$ which is the current through the DUT and the current mirror during stress.

Figure 8:
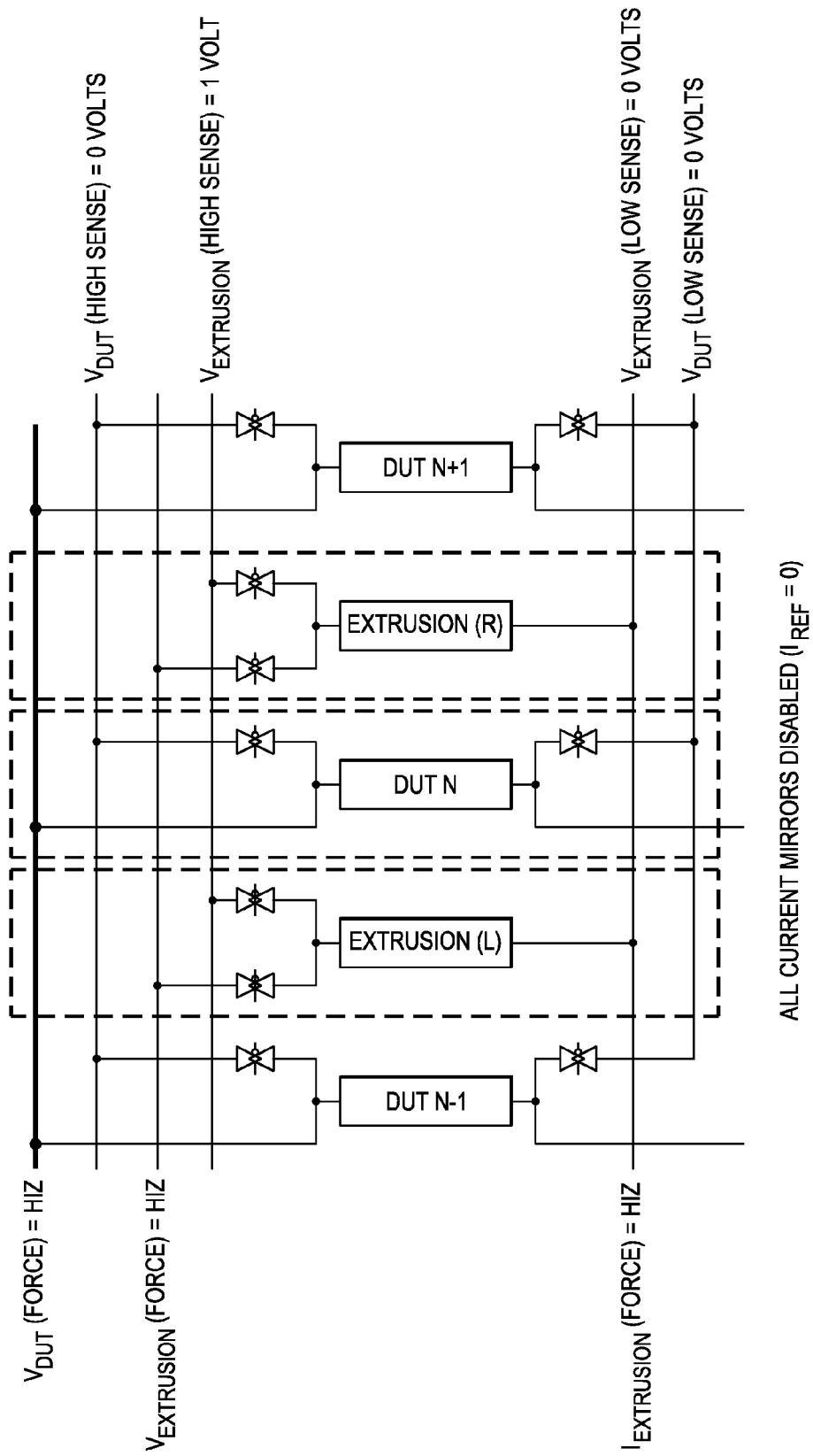
FIG. 8 is an example diagram illustrating DUT to extrusion shorts testing in accordance with one illustrative embodiment.

FIG. 8 is an example diagram illustrating DUT to extrusion shorts testing in accordance with one illustrative embodiment. As shown in FIG. 8, in order to perform a DUT to extrusion short test, the force inputs, i.e. $V_{DUT}$, $V_{EXTRUSION}$, AND $I_{EXTRUSION}$ are all set to high impedance (HIZ), i.e. disconnected or open such that no current is flowing in these lines. The reference current is set to 0 and a 0 Volt input is applied on the extrusion low sense line $V_{EXTRUSION}$ (Low Sense), the DUT voltage high sense line $V_{DUT}$ (High Sense), and the DUT voltage low sense line $V_{DUT}$ (Low Sense). A 1 Volt input is applied on the $V_{EXTRUSION}$ high sense line. A DUT for measurement is selected using the DUT selection logic scan chain. The currents on the $V_{EXTRUSION}$ high sense line and $V_{EXTRUSION}$ low sense line are recorded and if these currents are equal, there is no short detected. However, if the currents are not equal, then a DUT to extrusion short is detected. This process may be repeated for each DUT in the DUT array.

Thus, the mechanisms of the illustrative embodiments provide a parallel architecture by which DUTs in a DUT array may be subjected to EM stress testing in a parallel manner using the same four pads/pins for testing of all of the DUTs. This greatly reduces the number of pads/pins necessary to perform EM stress testing as well as decreases the time to perform such EM stress testing since all of the DUTs may be subjected to the EM stress tests in parallel and selective measuring of individual DUTs may be performed. The DUT array is thermally isolated from the active elements of the parallel architecture such that the high temperatures required to stress the DUTs does not cause the active elements to cease functioning. Moreover, the mechanisms of the illustrative embodiments ensure a constant current is applied to each DUT of the DUT array.

Figure 1:
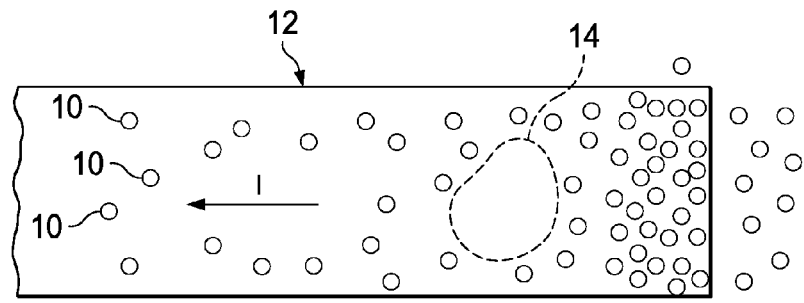
FIG. 1 is an example diagram illustrating electro-migration of a conductor.
Figure 9:
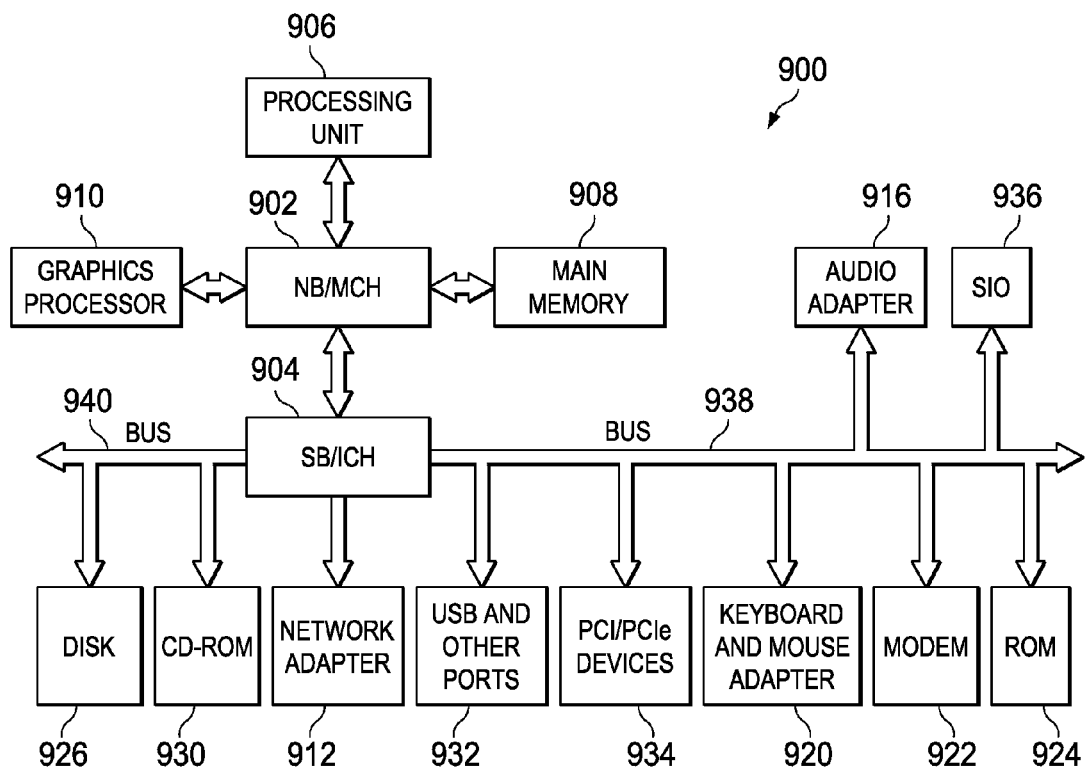
FIG. 9 is an example diagram of a data processing system that may be used as a testing control device in accordance with one illustrative embodiment.

As discussed above, the mechanisms of the illustrative embodiments include an EM stress test control device that provides the inputs, receives the outputs, and analyzes the outputs to perform the various functions for identifying failures of DUTs and characterizing the operation of the mechanisms of the illustrative embodiments under EM stress test conditions. The EM stress test control device may be any computing device capable of providing such inputs, receiving such outputs, and analyzing the outputs to perform the various computations necessary to achieve the purposes of the illustrative embodiments. Such computing devices may take many different forms and configurations. FIG. 9, hereafter, is provided as just one example of a data processing system that may be used as an EM stress test control device in accordance with one illustrative embodiment.

With reference now to FIG. 9, a block diagram of an example data processing system is shown in which aspects of the illustrative embodiments may be implemented. Data processing system 900 is an example of a computer in which computer usable code or instructions implementing the processes for illustrative embodiments of the present invention may be located.

In the depicted example, data processing system 900 employs a hub architecture including north bridge and memory controller hub (NB/MCH) 902 and south bridge and input/output (I/O) controller hub (SB/ICH) 904. Processing unit 906, main memory 908, and graphics processor 910 are connected to NB/MCH 902. Graphics processor 910 may be connected to NB/MCH 902 through an accelerated graphics port (AGP).

In the depicted example, local area network (LAN) adapter 912 connects to SB/ICH 904. Audio adapter 916, keyboard and mouse adapter 920, modem 922, read only memory (ROM) 924, hard disk drive (HDD) 926, CD-ROM drive 930, universal serial bus (USB) ports and other communication ports 932, and PCI/PCIe devices 934 connect to SB/ICH 904 through bus 938 and bus 940. PCI/PCIe devices may include, for example, Ethernet adapters, add-in cards, and PC cards for notebook computers. PCI uses a card bus controller, while PCIe does not. ROM 924 may be, for example, a flash basic input/output system (BIOS).

HDD 926 and CD-ROM drive 930 connect to SB/ICH 904 through bus 940. HDD 926 and CD-ROM drive 930 may use, for example, an integrated drive electronics (IDE) or serial advanced technology attachment (SATA) interface. Super I/O (SIO) device 936 may be connected to SB/ICH 904.

An operating system runs on processing unit 906. The operating system coordinates and provides control of various components within the data processing system 900 in FIG. 9. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 900 (Java is a trademark of Sun Microsystems, Inc. in the United States, other countries, or both).

As a server, data processing system 900 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 900 may be a symmetric multiprocessor (SMP) system including a plurality of processors in processing unit 906. Alternatively, a single processor system may be employed.

Instructions for the operating system, the object-oriented programming system, and applications or programs are located on storage devices, such as HDD 926, and may be loaded into main memory 908 for execution by processing unit 906. The processes for illustrative embodiments of the present invention may be performed by processing unit 906 using computer usable program code, which may be located in a memory such as, for example, main memory 908, ROM 224, or in one or more peripheral devices 926 and 930, for example.

A bus system, such as bus 938 or bus 940 as shown in FIG. 9, may be comprised of one or more buses. Of course, the bus system may be implemented using any type of communication fabric or architecture that provides for a transfer of data between different components or devices attached to the fabric or architecture. A communication unit, such as modem 922 or network adapter 912 of FIG. 9, may include one or more devices used to transmit and receive data. A memory may be, for example, main memory 908, ROM 924, or a cache such as found in NB/MCH 902 in FIG. 9.

Those of ordinary skill in the art will appreciate that the hardware in FIG. 9 may vary depending on the implementation. Other internal hardware or peripheral devices, such as flash memory, equivalent non-volatile memory, or optical disk drives and the like, may be used in addition to or in place of the hardware depicted in FIG. 9. Also, the processes of the illustrative embodiments may be applied to a multiprocessor data processing system, other than the SMP system mentioned previously, without departing from the spirit and scope of the present invention.

Moreover, the data processing system 900 may take the form of any of a number of different data processing systems including client computing devices, server computing devices, a tablet computer, laptop computer, telephone or other communication device, a personal digital assistant (PDA), or the like. In some illustrative examples, data processing system 900 may be a portable computing device which is configured with flash memory to provide non-volatile memory for storing operating system files and/or user-generated data, for example. Essentially, data processing system 900 may be any known or later developed data processing system without architectural limitation.

As will be appreciated by one skilled in the art, the EM stress test control device functionality may be embodied as a system, method, or computer program product in conjunction with the parallel architecture circuitry described previously. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In addition, the program code may be embodied on a computer readable storage medium on the server or the remote computer and downloaded over a network to a computer readable storage medium of the remote computer or the users' computer for storage and/or execution. Moreover, any of the computing systems or data processing systems may store the program code in a computer readable storage medium after having downloaded the program code over a network from a remote computing system or data processing system.

The illustrative embodiments are described herein with reference to a flowchart illustration and block diagrams of methods, apparatus (systems) and computer program products according to the illustrative embodiments of the invention. It will be understood that each block of the flowchart illustration and/or block diagrams, and combinations of blocks in the flowchart illustration and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 10:
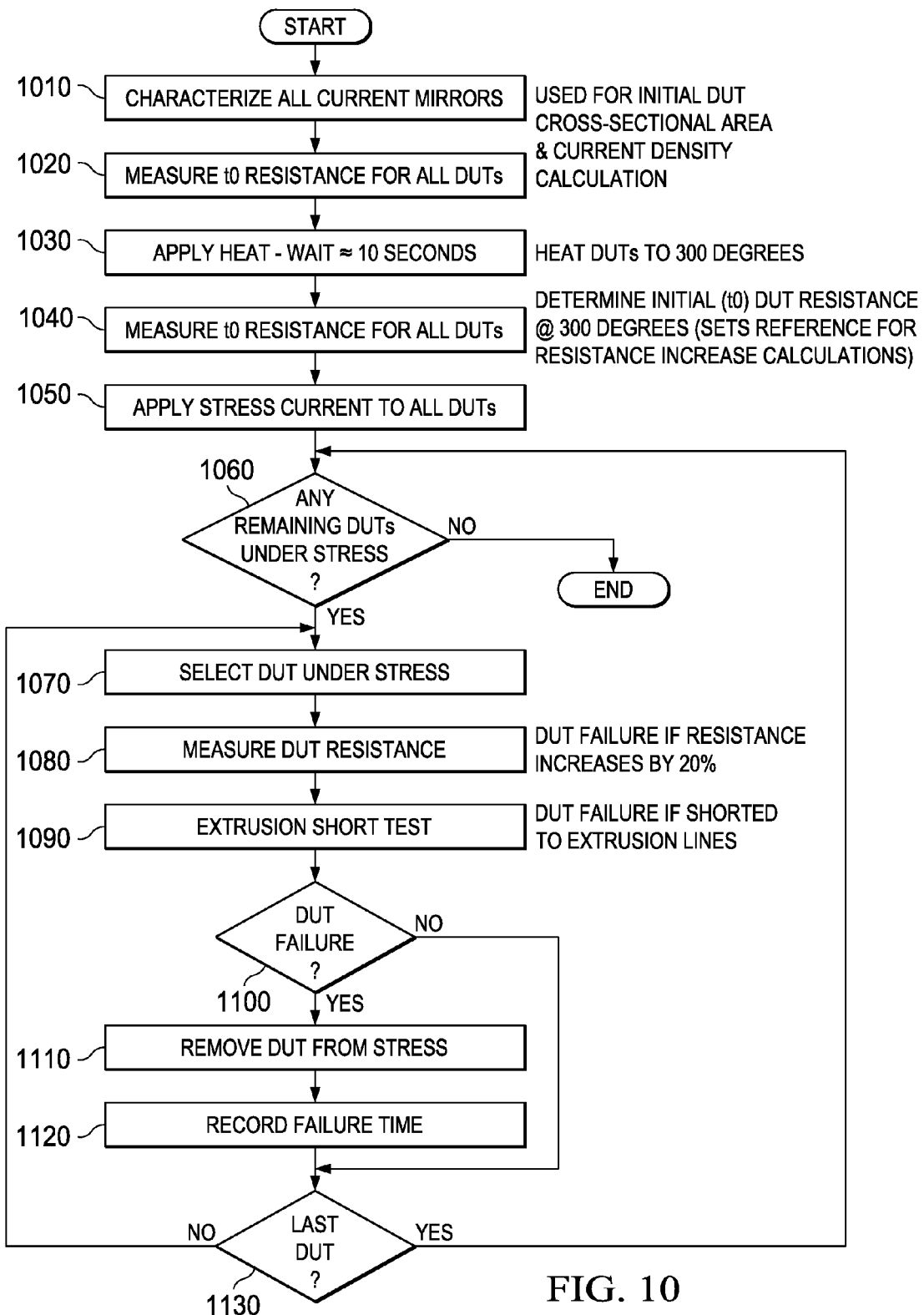
FIG. 10 is an example flowchart outlining an exemplary operation for performing an EM stress test in accordance with one illustrative embodiment.

FIG. 10 is an example flowchart outlining an exemplary operation for performing an EM stress test in accordance with one illustrative embodiment. As shown in FIG. 10, the operation starts by characterizing the current mirrors of the parallel architecture (step 1010). The resistance of the DUTs at a time t0 when no stress is applied to the DUTs is measured (step 1020). Steps 1010 and 1020 provide information for determining the initial DUT cross sectional area and current density.

Thereafter, heat is applied to the DUTs via the local heater elements and time is allowed to pass for the temperature across the DUT array to equalize (step 1030). The resistance of the DUTs at time t1 under the thermal stress from the application of the heat is measured (step 1040). This sets the reference resistance for later resistance increase calculations. Thereafter, the current stress is applied to all of the DUTs (step 1050).

A determination is made as to whether any remaining DUTs in the DUT array are under stress (step 1060). That is, if none of the DUTs are under stress then the EM stress test has ended and the operation terminates. Otherwise, if any of the DUTs is still under stress, then the EM stress test continues. A DUT may not be under stress because it has been determined to have failed and is removed from the stress testing, as discussed below. If all DUTs have failed, then the EM stress test is ended.

A next DUT under stress is selected (step 1070) and the DUT's resistance is measured using the mechanisms previously described (step 1080). In addition, an extrusion short test for this DUT is also performed (step 1090) and a determination is made as to whether the measured DUT resistance and/or the extrusion short test indicate failure of the DUT (step 1100). If so, then the DUT is removed from the stress test (step 110) and the failure time of the DUT is recorded (step 1120). Thereafter, or if the DUT did not fail, a determination is made as to whether this is the last DUT to measure (step 1130). If not, then the operation returns to step 1060 and a next DUT is selected. If this is the last DUT to measure, then the operation returns to step 1060.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus, comprising:
    a device under test (DUT) array having a plurality of DUTs coupled in parallel and a plurality of localized heating elements associated with respective ones of the DUTs in the DUT array; and
    active logic elements coupled to the DUT array for selectively enabling or disabling electro-migration stress testing of individual DUTs in the DUT array, wherein the active logic elements are thermally isolated from the DUT array such that the active logic elements actively operating while the DUT array is subjected to heating by the plurality of localized heating elements, wherein the active logic elements comprise:
    DUT selection logic, coupled to the DUT array, that selectively isolates individual DUTs within the DUT array;
    current source logic, coupled to the DUT array, that controls a current through the individual DUTs in the DUT array such that each DUT in the DUT array has a fixed current applied during electro-migration stress testing; and
    current source enable logic coupled to the current source logic that selectively enables portions of the current source logic.

2. The apparatus of claim 1, wherein the heating elements, DUT selection logic, current source logic, and current source enable logic operate to perform electro-migration stress testing on individual DUTs of the DUT array based on a DUT selection performed by the DUT selection logic, and current source logic providing a current source to individual DUTs of the DUT array in accordance with a setting of the current source enable logic.

3. The apparatus of claim 1, wherein the DUT array comprises:

voltage lines that apply a voltage to the individual DUTs in the DUT array and to apply a voltage to the individual heater units associated with the individual DUTs; and sense lines that sense a voltage and a current to characterize a temperature and a resistance of the individual DUTs in the DUT array, and wherein the individual DUTs in the DUT array are coupled to the voltage lines and sense lines in parallel.

4. The apparatus of claim 1, wherein the current source logic comprises a plurality of tunable multi-tapped current mirror elements that control a current through the individual DUTs in the DUT array to be a constant current, and wherein the plurality of tunable multi-tapped current mirror elements:

operate to isolate corresponding individual DUTs in the DUT array, and have tunable gains for allowing initial current densities through DUTs in the DUT array having different cross-sectional areas to be approximately the same.

5. The apparatus of claim 1, wherein the DUT array is thermally isolated from the active logic elements by localized metal structures operating as heat sinks that direct thermal energy away from the active logic elements.

6. The apparatus of claim 1, wherein the DUT selection logic and current source enable logic operate to sequentially select individual DUTs in the DUT array and performs measurements of electro-migration effects on the individual DUTs in the DUT array while isolating the individual DUTs from other DUTs in the DUT array when the electro-migration effects on the individual DUTs are being measured.

7. The apparatus of claim 1, wherein the current source enable logic selectively enables/disables one or more current mirror logic elements of the current source logic based on a current source input signal from an electro-migration test control device, wherein:

when performing electro-migration stress testing of an individual DUT in the DUT array, the current source enable logic enables current mirror logic elements associated with the individual DUT, when performing a DUT to extrusion element short test, the current mirror logic elements associated with the individual DUT are disabled by the current source enable logic, and when performing current mirror characterization operations, all of the current mirror logic elements of the current source logic are turned off by the current source enable logic except a current mirror logic element that is being characterized.

8. The apparatus of claim 1, wherein:

a DUT select input signal is received by the DUT selection logic and identifies which selected DUT in the DUT array to isolate for purposes of measurement of the selected DUT's resistance or performance of a DUT to extrusion element short test, a corresponding DUT selection logic element of the DUT selection logic outputs an "on" signal to switch elements of the DUT array for enabling an output of the selected DUT on a DUT high sense line and a DUT low sense line, other DUT selection logic elements of the DUT selection logic output "off" signals for keeping their corresponding DUTs in the DUT array turned off so that the output on the DUT high sense line is the output of the selected DUT, the "on" signal is output to one or more OR gates of the DUT selection logic corresponding to the DUT selection logic element and one or more adjacent DUT selection logic element, the one or more OR gates receiving outputs from two adjacent DUT selection logic elements in the DUT selection logic such that if at least one of the inputs to the OR gate is an "on" signal input, then the output of the OR gate is also an "on" signal output, and an output of the one or more OR gates is sent to one or more corresponding switch elements associated with extrusion elements of the DUT array to thereby enable or disable the extrusion elements such that an output of the extrusion elements is provided or not provided on an extrusion high sense line and an extrusion low sense line.

9. The apparatus of claim 1, wherein:

determining an initial resistance of a selected DUT in the DUT array by selectively enabling the selected DUT using the DUT selection logic, selectively enabling the current source logic for the selected DUT using the current source enable logic, and measuring outputs on a DUT voltage/high sense line and DUT low sense line, determining an initial DUT cross-sectional area and initial current density based on the initial resistance, applying heat to the selected DUT to drive a temperature of the selected DUT to a predetermined stress temperature for performing electro-migration stress testing by providing a voltage to one or more heating elements of the DUT array associated with the selected DUT and pulling current through the one or more heating elements, determining an original resistance of the selected DUT at the stress temperature by selectively enabling the selected DUT using the DUT selection logic, selectively enabling the current source logic for the selected DUT using the current source enable logic, and measuring outputs on the DUT voltage/high sense line and DUT low sense line, applying a stress current to the selected DUT by enabling current source logic associated with the selected DUT such that a reference current is mirrored through the selected DUT to thereby drive the current through the selected DUT to be either the reference current or a multiple of the reference current based on the cross-sectional area of the selected DUT, measuring the resistance of the selected DUT by measuring a current going through the selected DUT, isolating the selected DUT for voltage measurement by detecting a difference between the output on the DUT voltage/high sense and the output on the DUT low sense line, and calculating the resistance based on the measured current and voltage, and determining if a difference between the measured resistance of the selected DUT and the original resistance is greater than a predetermined amount, wherein if the difference in greater than the predetermined amount, the DUT is determined to have failed due to electro-migration effects.

10. An apparatus, comprising:

a device under test (DUT) array having a plurality of DUTs coupled in parallel and a plurality of localized heating elements associated with respective ones of the DUTs in the DUT array; and active logic elements coupled to the DUT array for selectively enabling or disabling electro-migration stress testing of individual DUTs in the DUT array, wherein the active logic elements are thermally isolated from the DUT array such that the active logic elements actively operating while the DUT array is subjected to heating by the plurality of localized heating elements, wherein the DUT array further comprises:

extrusion elements coupled to voltage extrusion and current extrusion lines in parallel; and four output elements coupled to the DUT array, a first output element being coupled to a voltage line coupled to the individual DUTs of the DUT array, a second output element being coupled to the voltage extrusion line, a third output element being coupled to the current extrusion line, and a fourth output element being coupled to a low sense line coupled to the individual DUTs of the DUT array, and wherein the same four output elements are used to sense the outputs for characterizing the electro-migration effects on each of the individual DUTs of the DUT array.

11. The apparatus of claim 10, wherein the four output elements are further coupled to an electro-migration test control device, and wherein the electro-migration test control device analyzes the outputs to characterize electro-migration effects on the individual DUTs in the DUT array.

12. The apparatus of claim 11, wherein the electro-migration test control device:
  determines a resistance value for an individual DUT in the DUT array,
  compares the resistance value to a baseline or original resistance value for the individual DUT to determine if a difference between the resistance value and the baseline or original resistance value is equal to or greater than a predetermined threshold,
  determines that the individual DUT has experienced electro-migration effects in response to the comparison indicating that the difference in the resistance value and the baseline or original resistance value is equal to or greater than the predetermined threshold, and
  determining a mean time to failure for the array of DUTs based on failure times resulting from the determination that the individual DUTs have experienced electro-migration effects causing a failure.

13. The apparatus of claim 10, wherein an extrusion short test is performed by determining a resistance between a DUT high sense line and the voltage extrusion line when a selected DUT is selected for measurement, wherein if the resistance between the DUT high sense line and voltage extrusion line is determined to be relatively high, then no short is determined to have occurred, and wherein if the resistance between the DUT high sense line and voltage extrusion line is determined to be relatively low, a short is determined to have occurred.

14. A method, in a data processing system, for performing electro-migration stress testing of individual devices under test (DUTs) in a DUT array having a plurality of DUTs coupled in parallel and a plurality of localized heating elements associated with respective ones of the DUTs in the DUT array, the method comprising:
  providing inputs to active logic elements coupled to the DUT array for selectively enabling or disabling electro-migration stress testing of individual DUTs in the DUT array;
  performing electro-migration stress testing on individual DUTs in the DUT array based on the inputs to the active logic elements;
  performing short testing on individual DUTs in the DUT array based on the inputs to the active logic elements; and
  determining if the individual DUTs in the DUT array have failed due to electro-migration effects based on the results of the electro-migration stress testing and short testing on the individual DUTs in the DUT array, wherein the active logic elements are thermally isolated from the DUT array such that the active logic elements actively operating while the DUT array is subjected to heating by the plurality of localized heating elements based on the inputs to the active logic elements.

15. The method of claim 14, wherein the active logic elements comprise:
  DUT selection logic, coupled to the DUT array, that selectively isolates individual DUTs within the DUT array;
  current source logic, coupled to the DUT array, that controls a current through the individual DUTs in the DUT array such that each DUT in the DUT array has a fixed current applied during electro-migration stress testing; and
  current source enable logic coupled to the current source logic that selectively enables portions of the current source logic.

16. The method of claim 15, wherein performing the electro-migration stress testing on individual DUTs in the DUT array comprises:
  applying heat to a selected DUT to drive a temperature of the selected DUT to a predetermined stress temperature for performing electro-migration stress testing, using the DUT selection logic and current source enable logic to isolate the selected DUT;
  applying a stress current to the selected DUT using the DUT selection logic and current source enable logic to isolate the selected DUT;
  measuring a resistance of the selected DUT under the heat applied to the selected DUT and the stress current applied to the selected DUT;
  comparing the measured resistance with an original resistance of the selected DUT; and
  determining if the selected DUT has failed due to electro-migration effects based on the comparison.

17. The method of claim 16, wherein:
  applying heat to the selected DUT to drive a temperature of the selected DUT to a predetermined stress temperature for performing electro-migration stress testing comprises providing a voltage to one or more heating elements of the DUT array associated with the selected DUT and pulling current through the one or more heating elements; and
  applying a stress current to the selected DUT comprises enabling current source logic associated with the selected DUT such that a reference current is mirrored through the selected DUT to thereby drive the current through the selected DUT to be either a reference current or a multiple of the reference current based on a cross-sectional area of the selected DUT.

18. The method of claim 16, wherein measuring the resistance of the selected DUT comprises:
  measuring a current going through the selected DUT;
  isolating the selected DUT for voltage measurement by detecting a difference between the output on a DUT voltage/high sense and the output on a DUT low sense line; and
  calculating the resistance based on the measured current and voltage.

19. The method of claim 16, wherein comparing the measured resistance with an original resistance of the selected DUT comprises determining if a difference between the measured resistance of the selected DUT and the original resistance is greater than a predetermined amount, wherein if the difference in greater than the predetermined amount, the DUT is determined to have failed due to electro-migration effects.

* * * * *